Figure 1:
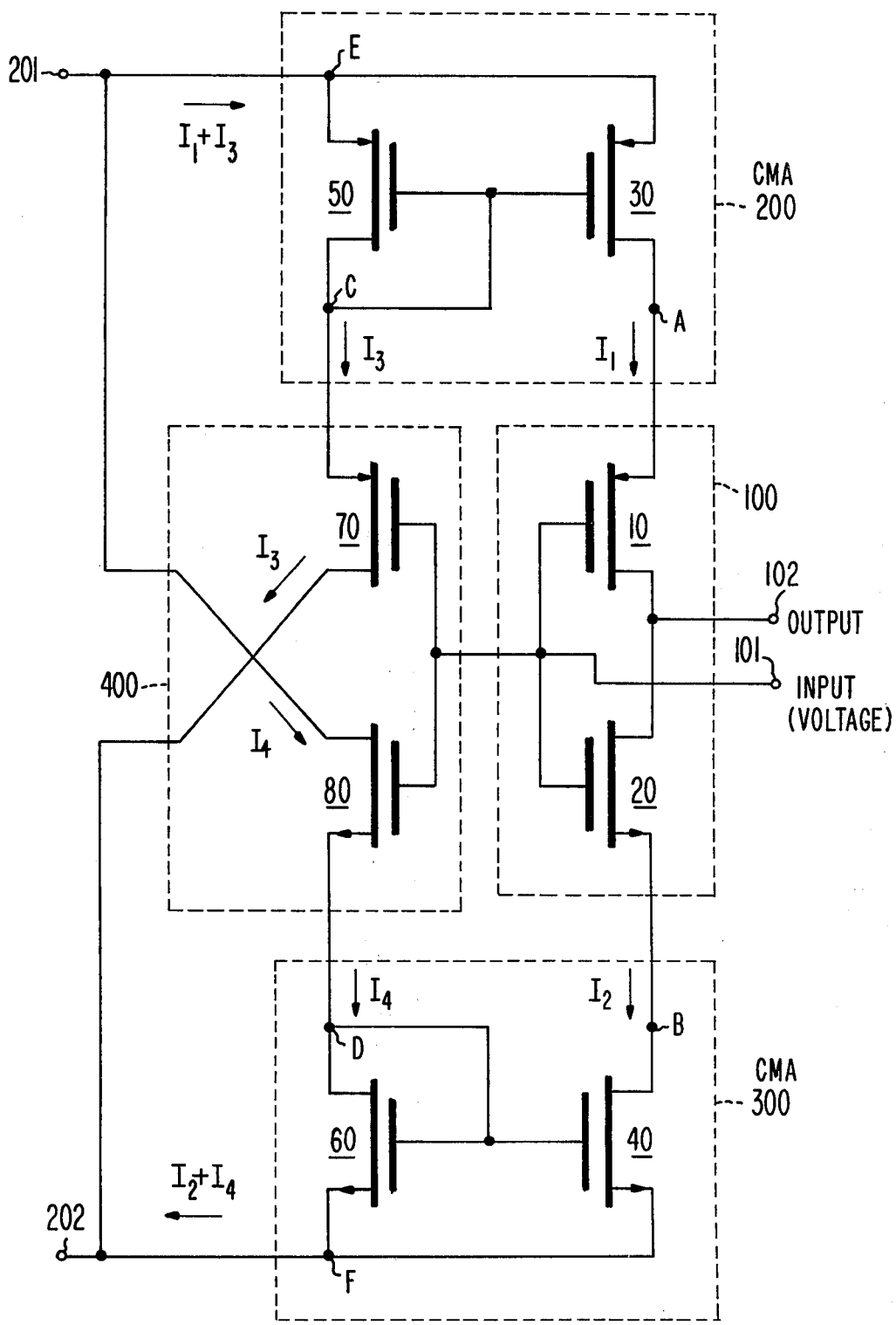

United States Patent [19]

Hsu

[11] 4,045,747
[45] Aug. 30, 1977

[54] COMPLEMENTARY FIELD EFFECT TRANSISTOR AMPLIFIER

[75] Inventor: Sheng Teng Hsu, Lawrenceville, N.J.

[73] Assignee: RCA Corporation, New York, N.Y.

[21] Appl. No.: 699,849

[22] Filed: June 25, 1976

[51] Int. Cl.² .............................................. H03F 3/16
[52] U.S. Cl. ...................................... 330/35; 330/13;
330/17; 330/18; 330/22
[58] Field of Search ................. 323/4; 330/13, 17, 18,
330/22, 35, 40

[56] References Cited

U.S. PATENT DOCUMENTS 3,898,578   8/1975   Fletcher et al. .................. 330/40 X Primary Examiner—Lawrence J. Dahl
Attorney, Agent, or Firm—H. Christoffersen; A. L. Limberg; R. G. Coalter

[57] ABSTRACT

A pair of complementary field effect transistors are connected at the gates thereof to an input terminal for receiving an input signal and at the drains thereof to an output terminal for producing an output signal. The transistor source electrodes are biased by separate, controlled current sources for controlling the ratio of the source electrode currents in accordance with a parameter of the input signal, which parameter may be voltage or current.

18 Claims, 2 Drawing Figures

COMPLEMENTARY FIELD EFFECT TRANSISTOR AMPLIFIER

This invention relates to amplifiers and particularly to amplifiers employing complementary field effect transistors.

Amplifiers are known which comprise an input terminal connected to the gate electrodes of a pair of complementary field effect transistors (FETs), an output terminal connected to the transistor drain electrodes and in which a supply voltage, $V_s$, is applied across the transistor source electrodes. In analog applications, such amplifiers are customarily biased for class A operation to provide linear amplification by applying an input signal to the input terminal having a quiescent value equal to the average of the source electrode potentials (e.g., $V_s/2$ volts for a single-ended supply or zero volts for a balanced supply). Linear amplification results, notwithstanding the fact that the FETs are nonlinear devices, because each transistor serves, in a sense, as a nonlinear active load impedance for the other. The nonlinearities tend to cancel to produce an output signal linearly related to the input signal over a portion of the input signal range.

Heretofore the analog circuit applications of the prior art amplifier have been limited to those requiring only moderate voltage gain. One reason for this is that the transconductance, $gm$, of a typical field effect transistor is relatively low as compared, for example, with that of a typical bipolar transistor. A known technique for increasing amplifier voltage gain is to employ FETs having relatively large channel width-to-length (W/L) ratios. Gain is increased because $gm$ is a direct function of W/L. That approach is limited, however, both on an economic level and a technical performance level. Economically, a practical limit exists as W/L is increased, where the resultant increase in $gm$ does not justify the required increase in semiconductor area. (Semiconductor area is an important cost determining factor and particularly so in integrated circuits). But even in cases where semiconductor area is not a prime importance, technical performance may suffer by increasing W/L to achieve high $gm$ because of the resultant increase in interelectrode capacitances. Such increased capacitances may reduce the overall bandwidth both directly (shunting capacitance) and indirectly (Miller multiplied degenerative feedback capacitance). In other words, to provide high gain and minimized phase shift in a given amplifier, it may not be enough merely to improve the device itself.

It is also known that the voltage gain of the prior art amplifier may be increased by connecting a plurality of such amplifiers in cascade (i.e., the output of the first amplifier connected to the input of a second similar amplifier). A disadvantage of cascading is that each stage added introduces additional phase shift. While the added phase shift may not always be objectionable in certain open loop (i.e., feedforward) applications, it can lead to instability (such as oscillation) in certain closed loop (i.e., feedback) applications.

Accordingly, a need exists for an FET amplifier having improved performance but not requiring transistors of special construction. A need further exists for achieving high gain in a single amplifier, making cascading unnecessary thereby avoiding that source of increased phase shift. The present invention is directed to meeting those needs.

Figure 2:
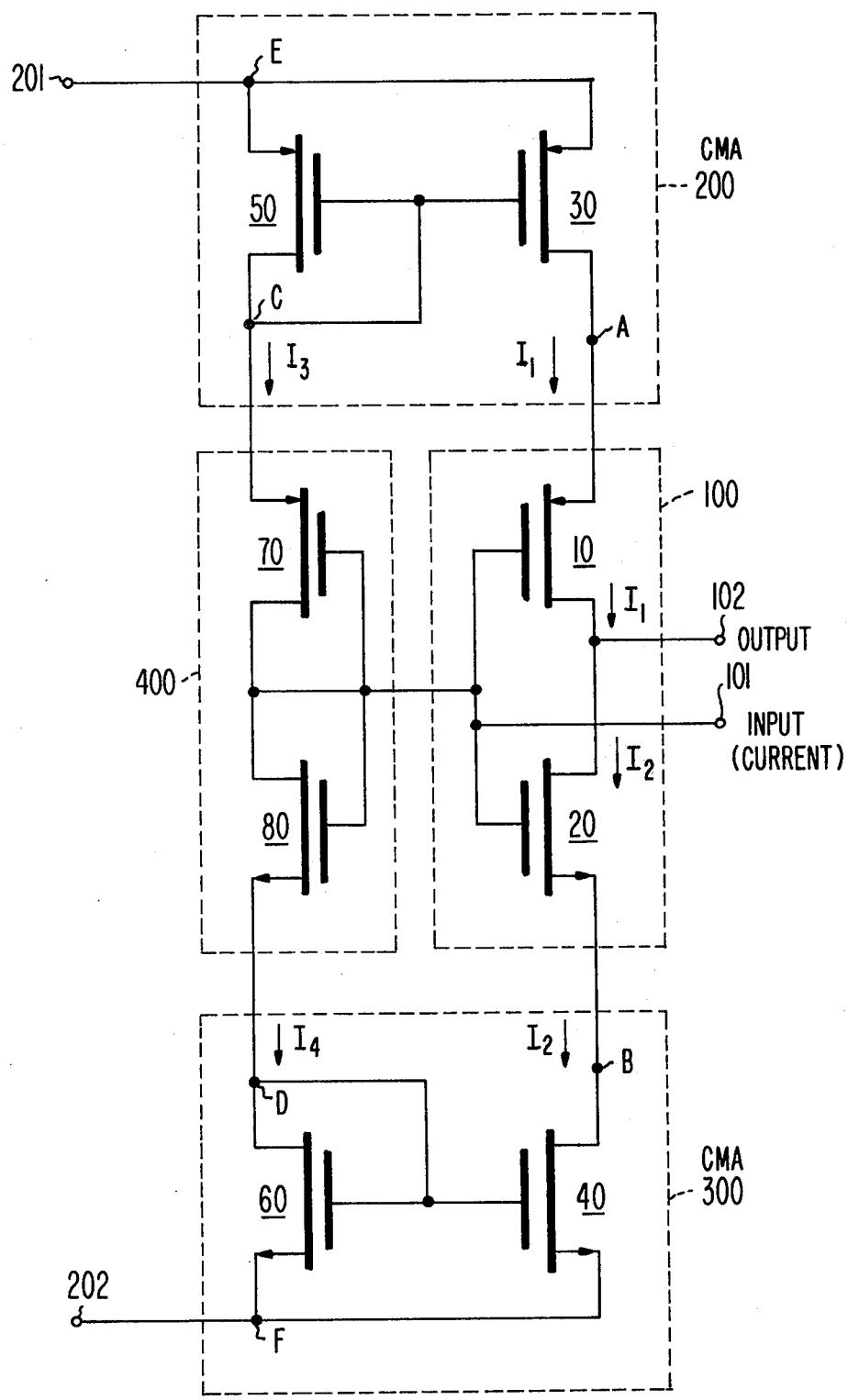

In the drawings:
FIG. 1 is a circuit diagram of an amplifier embodying the invention; and
FIG. 2 is a circuit diagram illustrating a modification of the amplifier of FIG. 1.

In FIG. 1, amplifier 100 is a complementary metal-oxide-semiconductor field effect transistor (CMOS) amplifier comprising a pair of complementary FETs 10 and 20 connected at the gate electrodes thereof to input terminal 101 and at the drain electrodes thereof to output terminal 102. Current is supplied to the source electrode of FET 10 and withdrawn from the source electrode of FET 20 by current mirror amplifiers (CMAs) 200 and 300, respectively.

CMA 200 comprises FETs 30 and 50 connected at the source electrodes thereof to node E, at the gate electrodes thereof to node C and at the drain electrodes thereof, respectively, to nodes A and C. Nodes C, E and A correspond to the input, common and output terminals of CMA 200. Nodes E and A are connected, respectively, to supply terminal 201 and to the source electrode of FET 10.

CMA 300 comprises FETs 40 and 60 connected at the source electrodes thereof to node F, at the gate electrodes thereof to node D and at the drain electrodes thereof, respectively, to nodes B and D. Nodes D, F and B correspond to the input, common and output terminals of CMA 300. Nodes F and B are connected, respectively, to supply terminal 202 and to the source electrode of FET 20.

Input circuit 400 supplies current to the input terminal (node D) of CMA 300, withdraws current from the input terminals (node C) of CMA 200 and controls the ratio of those currents in accordance with a parameter (in this case, voltage) of the input signal applied to input terminal 101. Circuit 400 comprises a pair of complementary FETs 70 and 80 connected at the gate electrodes thereof to terminals 101, at the source electrodes thereof, respectively, to nodes C and D and at the drain electrodes thereof, respectively, to supply terminals 202 and 201.

In operation, FETs 70 and 80 control the ratio of currents $I_3$ and $I_4$ in accordance with the value of the input voltage applied to input terminal 101. To illustrate, assume that supply terminal 202 is connected to a reference potential point such as ground and that a positive supply voltage, $V_s$, is applied to terminal 201. Assume initially that an input voltage is applied to terminal 101 equal to $V_s/2$. Under these conditions, FETs 50, 60, 70 and 80 will be conductive and currents $I_3$ and $I_4$ will flow between terminals 201 and 202. If the input voltage should increase by an increment $\Delta v$, the gate to source voltage of FET 80 will increase and that of FET 70 will decrease, thus causing an increase in current $I_4$ and a decrease in current $I_3$. Conversely, a decrease by an amount $\Delta v$ in the input voltage will cause an increase in current $I_3$ and a decrease in current $I_4$.

As a further illustration, assume that the transconductance of FET 70 equals that of FET 80 and also that the transconductance of FET 50 equals that of FET 60. Under these conditions, when the input voltage equals $V_s/2$, the gate to source voltages of FETs 70 and 80 will be equal and the current $I_3$ will equal $I_4$ (i.e., the ratio $I_3/I_4$ will be equal to unity). An incremental increase in the input voltage will thus cause the ratio $I_3/I_4$ to be less than unity and an incremental decrease in the input voltage will thus cause the current ratio $I_3/I_4$ to be greater than unity.

Currents $I_3$ and $I_4$ are the input currents of CMAs of 200 and 300, respectively. Preferably the current gain (that is, the ratio N of the output current divided by the input current) of CMA 200 equals that of CMA 300. The desired ratio may be achieved by selecting FET 30 to have a transconductance equal to N times that of FET 50 and selecting FET 40 to have a transconductance equal to N times that of FET 60.

Assume now, for purposes of discussion, that $N=1$. Under this condition the output current $I_1$ of CMA 200 will equal its input current $I_3$ and the output current $I_2$ of CMA 300 will equal its input current $I_4$. Under this condition then, when the input voltage equals $V_s/2$ current $I_1$ will equal current $I_2$. If the transconductance of FET 10 equals that of FET 20 and the transconductance of FET 30 equals that of FET 40, the voltage drop across the serially connected conduction channels of FETs 30 and 10 will equal that across the serially connected channels of FETs 20 and 40 so that the output voltage at terminal 102 will equal the assumed value of the input voltage applied to terminal 101 (i.e., $V_2/2$).

If now the input voltage increases by an increment $\Delta v$ the current $I_2$ will increase and current $I_1$ will decrease (i.e., the ratio $I_1/I_2$ will be less than unity). This affects the biasing of FETs 10 and 20 in two ways. Since $I_2$ is increased, the potential of node B (i.e., the drain to source voltage of FET 40) will decrease. Since the gate voltage of FET 40 is increased by $\Delta v$, the resultant change in gate-to-source voltage of FET 20 will be greater than the assumed change in the input voltage. Conversely, the reduction in current $I_1$ will cause a decrease in the potential of node A (i.e., the drain to source voltage of FET 30 will increase) so that the gate-to-source voltage of FET 10 will decrease by an increment greater than the assumed change in the input voltage. Stated another way, the "effective" change in the input signal for FETs 10 and 20 in amplifier 100 is greater than the actual change in the input signal applied to input terminal 101 so that the overall voltage gain of amplifier 100 is increased. The increase in the gain is not, however, due solely to the described effective increase in the input signal of amplifier 100 but is due to a further effect as well. That effect relates to an increase in the effective load impedance of FETs 10 and 20 in amplifier 100 provided by CMAs 200 and 300.

In more detail, if the source electrodes of FETs 10 and 20 were connected to low impedance voltage reference points, the equivalent load impedance of amplifier 100 would be equal to the reciprocal of the sum of the dynamic drain-to-source conductances of FETs 10 and 20. In the amplifier of FIG. 1, however, the source electrode of FETs 10 and 20 are not connected to low impedance points but are connected to very high impedance points, namely, the output teminals of CMAs 200 and 300. Thus, the effective load impedance is greatly increased and, since voltage gain is directly proportional to the load impedance, the voltage gain is increased also. These two effects (increased effective input signal voltage and increased effective load impedance) combine to provide a substantial increase in voltage gain as compared, for example, with the prior art amplifier previously discussed.

As an example, voltage gains in excess of 50 dB have been measured in an amplifier as shown in FIG. 1 constructed with transistors of type CD 4007 arrays. The CD 4007 array is a commercially available integrated circuit which includes three pair of complementary transistors (two such arrays were used to construct the eight transistor circuit of FIG. 1). In tests of the amplifier, it was found that the voltage gain was inversely proportional and the bandwidth directly proportional to the supply voltage applied across terminals 201 and 202. Thus the amplifier of FIG. 1 may be used for providing two quadrant multiplication or variable bandwidth filtering or both.

In the amplifier of FIG. 1, the drains of FETs 70 and 80 are connected to the supply terminals 202 and 201, respectively. This connection provides a high input impedance while producing the complementary currents $I_3$ and $I_4$. While a high input impedance is an advantage in, for example, voltage amplifying applications, there are other applications in which a low input impedance may be needed. For example, in current summing applications, voltage variations at the summing node may effect one or more of the input currents causing distortion (or errors) in the output current. The circuit of FIG. 1 may be modified as shown in FIG. 2 for providing a low input impedance needed for such current amplifying or summing applications.

In FIG. 2, the drains of FETs 70 and 80 are disconnected from terminals 202 and 201, respectively, and connected instead to input terminal 101. Operation of this example of the invention is similar to that previously described except that the input impedance is substantially reduced so that it is, in a sense, the input current, rather than the input voltage, which is the principal controlling parameter of the input signal.

Assume, for example, that FETs 50, 60, 70 and 80 are all of equal transconductance, gm. With an operating voltage applied across terminals 201 and 202 greater than the sum of four FET thresholds and with no current applied to input terminal 101 all transistors will operate in the saturation region of their drain characteristics and current $I_3$ will equal current $I_4$. The input impedance under this quiescent condition will be at its maximum value and will be approximately 1/gm. Assuming also that FETs 10, 20, 30 and 40 are of equal transconductance, currents $I_1$ and $I_2$ will be balanced also so that the output voltage will equal half the operating voltage (i.e., $V_s/2$ where $V_s$ is applied to terminal 201 and terminal 202 is grounded).

If now an input current, $I_{IN}$, is supplied to input terminal 101, this current will cause an increase in current $I_4$ so that the current ratio $I_3/I_4$ will become less than unity. Since $I_1$ is $I_3$ mirrored by FETs 30 and 50 and $I_2$ is $I_4$ mirrored by FETs 40 and 60, the result is that the current ratio $I_1/I_2$ will also become less than unity. Simultaneously, the increased $I_4$ current flowing through FETs 60 and 80 will raise the input terminal potential to a value greater than $V_{DD}/2$. The increased input terminal voltage both causes a decrease in input impedance and, in conjunction with the change in the current ratio $I_1/I_2$, increases the gate-to-source voltage of FET 20 and decreases that of FET 10, thereby decreasing the voltage at output terminal 102. Should $I_{IN}$ be applied in the opposite sense, the current ratios and input/output voltage relationships would be reversed. The input impedance, however, would decrease.

In more detail, the net input impedance may be approximated by the sum of the reciprocals of the transconductances of FETs 60 and 80 in parallel with the sum of the reciprocals of the transconductances of FETs 50 and 70. The transconductances of FETs 60 and 80 increase the magnitude of the potential difference between terminals 101 and 202, and the transconductances of FETs 50 and 70 increase as the magnitude of the potential difference between terminals 101 and 201. Accordingly, the maximum value the input impedance can assume occurs when the potential across FETs 60 and 80 equals that across FETs 50 and 70. That happens when the input current is zero whereby currents $I_3$ $I_4$ are balanced. Any input current, positive or negative, which would tend to unbalance currents $I_3$ and $I_4$, therefore, will reduce the input impedance.

In summary, the input impedance of the amplifier of FIG. 2 is relatively low, under the given assumptions having a maximum value of 1/gm. Thus, this example of the invention is well suited for current summing or amplifying applications. Further, since the input impedance decreases in response to input signal current flow in either direction the benefits of symmetrical limiting may be obtained.

In each example of the invention given, the source electrode of FETs 10 and 20 are biased by separate, controlled current devices which control the ratio of the source electrode currents in accordance with a parameter of the input signal. In the example of FIG. 1 the parameter is the signal voltage and in FIG. 2 the parameter is the signal current. The term "current source" means a source which produces and output current which is substantially independent of the voltage at its output terminal. Current mirror amplifiers fulfill this requirement in that the output current of a CMA is directly proportional to its input current and is independent of the voltage at its output terminal. Such amplifiers may be constructed with field effect transistors, as illustrated, or with bipolar transistors by replacing the P-channel FETs with PNP bipolar transistors in CMA 200 and replacing the N-channel FETs with NPN bipolar transistors in CMA 300.

What is claimed is:

1. In combination:
   first and second field effect transistors having conduction channels of opposite conductivity types connected in series between two circuit nodes, each transistor having source, gate and drain electrodes; said two source electrodes being connected to said two nodes, respectively and said two drain electrodes being connected to one another;
   a circuit input terminal coupled to said gate electrodes of said first and second transistors for applying an input signal thereto;
   a circuit output terminal coupled to said drain electrodes of said first and second transistors for providing an output signal;
   current controlled current source means for continuously supplying a first output current to said source electrode of said first transistor and controlling the value of said first output current in accordance with a first input current, and for continuously withdrawing a second output current from said source electrode of said second transistor and controlling the value of said second output current in accordance with a second input current; and
   circuit means for supplying said first and second input currents to said current controlled current source means and for controlling the ratio thereof in response to said input signal applied to said input terminal.

2. The combination recited in claim 1 further comprising first and second terminals for receiving an operating voltage thereacross and wherein said current controlled current source means comprises:
   first and second current mirror amplifiers, each having an input terminal, an output terminal and a sum terminal, said sum terminal being connected, respectively, to said first terminal and to said second terminal, said output terminals being connected, respectively, to said source electrode of said first transistor and to said source electrode of said second transistor, the input terminal of the first for receiving said first input current and the input terminal of the second for receiving said second input current.

3. The combination recited in claim 2 wherein said circuit means comprises:
   a first direct current conductive impedance element connected between said circuit input terminal and said first current mirror amplifier input terminal; and
   a second direct current impedance element connected between said circuit input terminal and said second current mirror amplifier input terminal.

4. The combination recited in claim 2 wherein said circuit means comprises:
   a third field effect transistor having a conduction channel of the same conductivity type as said first field effect transistor, having a source electrode connected to said first current mirror amplifier input terminal, having a drain electrode connected to said second terminal and having a gate electrode connected to said circuit input terminal; and
   a fourth field effect transistor having a conduction channel of the same conductivity type as said second transistor, having a source electrode connected to said second current mirror amplifier input terminal, having a drain electrode connected to said first terminal and having a gate electrode connected to said circuit input terminal.

5. The combination recited in claim 2 wherein said circuit means comprises:
   a third field effect transistor having a conduction channel of the same conductivity type as said first field effect transistor, having a source electrode connected to said first current mirror amplifier input terminal, and having a drain and a gate electrode, each connected to said circuit input terminal; and
   a fourth field effect transistor having a conduction channel of the same conductivity type as said second field effect transistor, having a source electrode connected to said second current mirror amplifier input terminal and having a drain and a gate electrode, each connected to said circuit input terminal.

6. The combination receited in claim 2 wherein
   said first current mirror amplifier comprises third and fourth field effect transistor of the same channel conductivity type as said first field effect transistor and connected at the source electrodes thereof to said first current mirror amplifier sum terminal, the gate and drain electrodes of the fourth transistor and the gate electrode of the third transistor being connected to said first current mirror amplifier input terminal, the drain electrode of the third transistor being connected to said first current mirror amplifier output terminal; and wherein
   said second current mirror amplifier comprises fifth and sixth field effect transistors of the same channel conductivity type as said second field effect transistor and connected at the source electrodes thereof to said second current mirror amplifier sum terminal, the gate and drain electrodes of the sixth transistor and the gate electrode of the fifth transistor being connected to said second current mirror amplifier input terminal, the drain electrode of the fifth transistor being connected to said second current mirror amplifier output terminal.

7. An amplifier, comprising:

first and second terminals for receiving an operating voltage therebetween;

first and second complementary field effect transistors having the drain electrodes thereof connected to a circuit output terminal and the gate electrodes thereof connected to a circuit input terminal;

a third field effect transistor of the same channel conductivity type as said first field effect transistor, the source and drain electrodes thereof being coupled, respectively to said first terminal and to the source electrode of said first transistor;

first voltage regulating means coupled to the gate electrode of said third transistor for regulating the gate-to-source voltage thereof in accordance with a first input current;

a fourth field effect transistor of the same channel conductivity type as said second field effect transistor, the source and drain electrodes thereof being coupled, respectively, to said second terminal and to the source electrode of said second transistor;

second voltage regulating means coupled to the gate electrode of said fourth transistor for regulating the gate-to-source voltage thereof in accordance with a second input current; and input means for supplying said first and second input currents to said first and second voltage regulating means and for controlling the ratio thereof in response to an input signal applied to said circuit input terminal.

8. The amplifier recited in claim 7 wherein:

said first regulator means comprises a fifth field effect transistor of the same channel conductivity type as said third field effect transistor, means coupling the source electrode of said fifth transistor to said first terminal, means coupling the gate and drain electrodes of said fifth transistor to the gate electrode of said third transistor and forming a first circuit node for receiving said first input current; and wherein said second regulator means comprises a sixth field effect transistor of the same channel conductivity type as said fourth field effect transistor, means coupling the source electrode of said sixth transistor to said second terminal, and means coupling the gate and drain electrodes of said sixth transistor to the gate electrode of said fourth transistor and forming a second circuit node for receiving said second input current.

9. The amplifier recited in claim 8 wherein said input means comprises:

a seventh field effect transistor of the same channel conductivity type as said fifth field effect transistor, said seventh transistor being connected at the source electrode thereof to said first circuit node and at the gate electrode thereof to said circuit input terminal;

an eighth field effect transistor of the same channel conductivity type as said sixth field effect transistor, said eighth transistor being connected at the source electrode thereof to said second circuit node and at the gate electrode thereof to said circuit input terminal; and means coupling the drain electrode of each of said seventh and eighth transistors to said circuit input terminal.

10. The amplifier recited in claim 8 wherein said input means comprises:

a seventh field effect transistor of the same channel conductivity type as said fifth field effect transistor, said seventh transistor being connected at the source electrode thereof to said first circuit node and at the gate electrode thereof to said circuit input terminal;

an eighth field effect transistor of the same channel conductivity type as said sixth field effect transistor, said eighth transistor being connected at the source electrode thereof to said second circuit node and at the gate electrode thereof to said circuit input terminal;

means for applying a first reference voltage to the drain electrode of said seventh transistor; and means for applying a second reference voltage to the drain electrode of said eighth transistor.

11. The amplifier recited in claim 10 wherein said means for applying said first reference voltage to the drain electrode of said seventh transistor comprises means coupling the drain electrode thereof to said second terminal and wherein said means for applying said second reference voltage to the drain electrode of said eighth transistor comprises means coupling the drain electrode thereof to said first terminal.

12. An amplifier, comprising, in combination:

an input terminal for receiving an input signal, an output terminal for providing an output signal and first and second supply terminals for receiving, respectively, first and second operating voltages;

first and second field effect transistors of a first conductivity type, each having source, gate and drain electrodes, the gate and drain electrodes of the first transistor being connected respectively, to said input and output terminals, the source and drain electrodes of the second transistor being connected, respectively, to said first supply terminal and to the source electrode of said first transistor;

third and fourth field effect transistors of a second conductivity type, each having source, gate and drain electrodes, the gate and drain electrodes of the third transistor being connected, respectively, to said input and output terminals, the source and drain electrodes of the fourth transistor being connected, respectively, to said second supply terminal and to the source electrode of said third transistor;

first means connected to said input terminal and to at least the first of said supply terminals for applying a bias voltage across the gate and source of electrodes of said second transistor in proportion to but less than the potential difference appearing between said first terminal and said input terminal; and second means connected to said input terminal and to at least the second of said supply terminals for applying a bias voltage across the gate and source electrodes of said fourth transistor in proportion to but less than the potential difference appearing between said second terminal and said input terminal.

13. The amplifier recited in claim 12 wherein said first means comprises a first impedance element connected between said first terminal and said gate electrode of said second transistor and a second impedance element connected between said input terminal and said gate electrode of said second transistor and wherein said second means comprises a third impedance element connected between said second terminal and said gate electrode of said fourth transistor and a fourth impedance element connected between said input terminal and said gate electrode of said fourth transistor.

14. The amplifier recited in claim 12 wherein said first means comprises fifth and sixth field effect transistors of said first conductivity type, each having source, gate and drain electrodes, the fifth transistor having the source electrode thereof coupled to said first terminal and the gate and drain electrodes thereof coupled to said gate electrode of said second transistor, the sixth transistor having the source electrode thereof coupled to said gate electrode of said second transistor and having the gate and drain electrodes thereof coupled to said input terminal; and wherein said second means comprises seventh and eighth field effect transistors of said second conductivity type, each having source, gate and drain electrodes, said seventh transistor having the source electrode thereof coupled to said second terminal and the gate and drain electrodes thereof coupled to said gate electrode of said fourth transistor, the eighth transistor having the source electrode therof coupled to said gate electrode of said fourth transistor and having the gate and drain electrodes thereof coupled to said input terminal.

15. The amplifier recited in claim 12 wherein said first means comprises fifth and sixth field effect transistors of said first conductivity type, each having source, gate and drain electrodes, the fifth transistor having the source electrode thereof coupled to said first terminal and the gate and drain electrodes thereof coupled to said gate electrode of said second transistor, the sixth transistor having the source electrode thereof coupled to said gate electrode of said second transistor and having the gate and drain electrodes thereof coupled, respectively, to said input terminal and said second terminal; and wherein said second means comprises seventh and eighth field effect transistors of said second conductivity type, each having source, gate and drain electrodes, said seventh transistor having the source electrode thereof coupled to said second terminal and the gate and drain electrodes thereof coupled to said gate electrode of said fourth transistor, the eighth transistor having the source electrode thereof coupled to said gate electrode of said fourth transistor and having the gate and drain electrodes thereof coupled, respectively, to said input terminal and said first terminal.

16. An amplifier, comprising:
    first and second field effect transistors of first and second conductivity types, respectively, each having source, gate and drain electrodes, said gate electrodes being connected to a signal input terminal, said drain electrodes being connected to a signal output terminal;
    first and second complementary current mirror amplifiers each having input, common output terminals, said common terminals for receiving an operating voltage thereacross, said output terminals being connected to respective ones of said source electrodes; and
    input means for supplying input currents to the input terminals of said current mirror amplifiers and for controlling the ratio thereof in accordance with an input signal applied to said input signal terminal.

17. The amplifier recited in claim 16 wherein said input means comprises:
    a third field effect transistor of said first conductivity type having a source electrode connected to said input terminal of said first current mirror amplifier, a drain electrode connected to said common terminal of said second current mirror amplifier and a gate electrode connected to said signal input terminal; and
    a fourth field effect transistor of said second conductivity type having a source electrode connected to said input terminal of said second current mirror amplifier, a drain electrode connected to said common terminal of said first current mirror amplifier and a gate electrode connected to said signal input terminal.

18. The amplifier recited in claim 16 wherein said input means comprises:
    a third field effect transistor of said first conductivity type having a source electrode connected to said input terminal of said first current mirror amplifier and having a drain electrode and a gate electrode, said drain and gate electrodes being connected to said signal input terminal; and
    a fourth field effect transistor of said second conductivity type having a source electrode connected to said input terminal of said second current mirror amplifier and having a gate electrode and a drain electrode, said gate and drain electrodes being connected to said signal input terminal.

* * * * *